(12) United States Patent
Siew et al.

(10) Patent No.: US 9,793,158 B2
(45) Date of Patent: Oct. 17, 2017

(54) METHODS OF FABRICATING A SEMICONDUCTOR DEVICE

(71) Applicant: SAMSUNG ELECTRONICS CO., LTD., Suwon-si, Gyeonggi-do (KR)

(72) Inventors: Yong Kong Siew, Suwon-si (KR); Hyunsu Kim, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/176,187

(22) Filed: Jun. 8, 2016

(65) Prior Publication Data
US 2017/0033004 A1    Feb. 2, 2017

(30) Foreign Application Priority Data

Jul. 31, 2015  (KR) .................. 10-2015-0108871

(51) Int. Cl.
*H01L 21/4763*   (2006.01)
*H01L 21/768*    (2006.01)

(52) U.S. Cl.
CPC .... *H01L 21/76871* (2013.01); *H01L 21/7682* (2013.01); *H01L 21/76802* (2013.01); *H01L 21/76832* (2013.01); *H01L 21/76834* (2013.01); *H01L 21/76858* (2013.01); *H01L 21/76865* (2013.01); *H01L 21/76877* (2013.01)

(58) Field of Classification Search
CPC ............. H01L 21/768; H01L 21/76801; H01L 21/76805
See application file for complete search history.

(56) References Cited

U.S. PATENT DOCUMENTS

| | | | |
|---|---|---|---|
| 8,415,248 B2 | 4/2013 | Chen et al. | |
| 8,652,962 B2 | 2/2014 | Singh et al. | |
| 8,673,779 B1 | 3/2014 | Yoon et al. | |
| 8,728,936 B1 | 5/2014 | Lu et al. | |
| 8,735,278 B2 | 5/2014 | Lee et al. | |
| 8,766,342 B2 | 7/2014 | Akolkar | |
| 8,907,483 B2 | 12/2014 | Zhao et al. | |
| 8,916,469 B2 | 12/2014 | Peng et al. | |
| 2003/0183940 A1* | 10/2003 | Noguchi ........... H01L 21/76801 257/767 |
| 2010/0013100 A1* | 1/2010 | Xiao ................. H01L 23/53238 257/751 |
| 2014/0124932 A1 | 5/2014 | Tsai et al. | |
| 2014/0252630 A1 | 9/2014 | Chang et al. | |

(Continued)

*Primary Examiner* — Selim Ahmed
*Assistant Examiner* — Evan Clinton
(74) *Attorney, Agent, or Firm* — Lee & Morse, P.C.

(57) ABSTRACT

A method of fabricating a semiconductor device, the method including forming at least one interconnection structure that includes a metal interconnection and a first insulating pattern sequentially stacked on a substrate; forming barrier patterns covering sidewalls of the interconnection structure; forming second insulating patterns at sides of the interconnection structure, the second insulating patterns being spaced apart from the interconnection structure with the barrier patterns interposed therebetween; forming a via hole in the first insulating pattern by etching a portion of the first insulating pattern, the via hole exposing a top surface of the metal interconnection and sidewalls of the barrier patterns; and forming a via in the via hole.

20 Claims, 24 Drawing Sheets

(56) References Cited

U.S. PATENT DOCUMENTS

| | | | |
|---|---|---|---|
| 2014/0291819 A1* | 10/2014 | Barth | H01L 23/53276 257/659 |
| 2015/0108646 A1 | 4/2015 | Chae et al. | |
| 2015/0348832 A1* | 12/2015 | Bruce | H01L 21/76885 257/761 |
| 2016/0133513 A1* | 5/2016 | Hegde | H01L 23/53238 438/618 |
| 2016/0240371 A1* | 8/2016 | Posseme | H01L 21/28518 |

* cited by examiner

METHODS OF FABRICATING A SEMICONDUCTOR DEVICE

CROSS-REFERENCE TO RELATED APPLICATION

Korean Patent Application No. 10-2015-0108871, filed on Jul. 31, 2015, in the Korean Intellectual Property Office, and entitled: "Methods of Fabricating A Semiconductor Device," is incorporated by reference herein in its entirety.

BACKGROUND

1. Field

Embodiments relate to methods of fabricating a semiconductor device.

2. Description of the Related Art

In a metal interconnection process, a metal interconnection may be formed to be connected to a circuit formed on a semiconductor substrate. Generally, a metal interconnection may be formed of a metal material such as tungsten (W), copper (Cu), gold (Au), or aluminum (Al). For example, copper and aluminum having low specific resistances may be used as a material of a metal interconnection. Recently, copper (having a higher electric conductivity than aluminum) has been mainly used as a material of a metal interconnection.

SUMMARY

Embodiments are directed to methods of fabricating a semiconductor device.

The embodiments may be realized by providing a method of fabricating a semiconductor device, the method including forming at least one interconnection structure that includes a metal interconnection and a first insulating pattern sequentially stacked on a substrate; forming barrier patterns covering sidewalls of the interconnection structure; forming second insulating patterns at sides of the interconnection structure, the second insulating patterns being spaced apart from the interconnection structure with the barrier patterns interposed therebetween; forming a via hole in the first insulating pattern by etching a portion of the first insulating pattern, the via hole exposing a top surface of the metal interconnection and sidewalls of the barrier patterns; and forming a via in the via hole.

Forming the interconnection structure may include sequentially forming a first barrier layer, a metal layer, a second barrier layer, a first insulating layer, and a first hard mask pattern on the substrate; and patterning the first insulating layer, the second barrier layer, the metal layer, and the first barrier layer using the first hard mask pattern as an etch mask to form a first barrier pattern, the metal interconnection, a second barrier pattern, and the first insulating pattern, which are sequentially stacked on the substrate.

Forming the first barrier layer may include forming a seed layer on the substrate, the seed layer including manganese; and performing an annealing process on the seed layer such that the manganese of the seed layer reacts with oxygen from the substrate to convert the seed layer into a manganese oxide layer or a manganese-silicon oxide layer.

Forming the interconnection structure may further include performing a thermal treatment process on the metal layer before forming the first hard mask pattern.

Forming the barrier patterns and the second insulating patterns may include forming a barrier layer that conformally covers a top surface of the substrate and a surface of the interconnection structure; forming a second insulating layer that covers the barrier layer on the interconnection structure; and removing an upper portion of the second insulating layer and an upper portion of the barrier layer until a top surface of the first insulating pattern is exposed.

Forming the barrier layer and an etching process for forming the interconnection structure may be performed in-situ in a same chamber, and forming the barrier layer may be performed after the etching process for forming the interconnection structure.

The method may include forming a plurality of the interconnection structures, forming the second insulating layer may include forming an air gap surrounded by the second insulating layer between the interconnection structures, and a top end of the air gap may be formed at a lower level than the top surface of the first insulating pattern.

The second insulating patterns and the barrier patterns may be formed of materials having an etch selectivity with respect to the first insulating pattern, and the second insulating patterns may include a different material from the barrier patterns.

Forming the via hole may include selectively etching the portion of the first insulating pattern using an etchant having an etch selectivity with respect to the second insulating patterns and the barrier patterns.

The first insulating pattern may be formed of a carbon-based polymer material or a silicon-based insulating material, the second insulating patterns may be formed of a carbon-based polymer material or a silicon-based insulating material, and the first insulating pattern may be formed of a material having an etch selectivity with respect to the second insulating patterns.

The via may include a different conductive material from the metal interconnection, the metal interconnection may include copper, and the via may include ruthenium, cobalt, nickel, titanium, tantalum, or an alloy including at least one thereof.

The method may further include forming an upper interconnection structure on the interconnection structure in which the via is formed, wherein forming the upper interconnection structure may include forming a first upper barrier pattern, an upper metal interconnection, a second upper barrier pattern, and an upper insulating pattern which are sequentially stacked on the interconnection structure.

The embodiments may be realized by providing a method of fabricating a semiconductor device, the method including forming interconnection structures that each include a metal interconnection and a first insulating pattern sequentially stacked on a substrate and extending in one direction; forming barrier patterns that cover sidewalls of the interconnection structures; forming second insulating patterns that are in contact with the barrier patterns and that fill spaces between the interconnection structures, the second insulating patterns extending in the one direction; forming a hard mask layer such that the hardmask layer includes an opening on the interconnection structures and the second insulating patterns, the opening exposing a portion of the first insulating pattern; etching the portion of the first insulating pattern exposed by the opening to form a via hole in the first insulating pattern, the via hole exposing a top surface of the metal interconnection and sidewalls of the barrier patterns; and forming a via in the via hole.

The second insulating patterns and the barrier patterns may be formed of materials having an etch selectivity with respect to the first insulating patterns, and the second insulating patterns may include a different material from the barrier patterns.

The first insulating patterns may include a carbon-based polymer material or a silicon-based insulating material, the second insulating patterns may include a carbon-based polymer material or a silicon-based insulating material, and the barrier patterns may include at least one of silicon nitride, silicon carbonitride, or aluminum nitride.

The embodiments may be realized by providing a method of fabricating a semiconductor device, the method including forming interconnection structures that each include a metal interconnection and a first insulating pattern sequentially stacked on a substrate and extending in one direction; forming barrier patterns that cover sidewalls of the interconnection structures; forming second insulating patterns that are in contact with the barrier patterns and that fill spaces between the interconnection structures, the second insulating patterns extending in the one direction; forming a via hole in the first insulating pattern by etching a portion of the first insulating pattern, the via hole exposing a top surface of the metal interconnection and sidewalls of the barrier patterns; and forming a via in the via hole.

Wherein forming the via hole includes forming a hard mask layer such that the hardmask layer includes an opening on the interconnection structures and the second insulating patterns, the opening exposing a portion of the first insulating pattern, and etching the portion of the first insulating pattern exposed by the opening to form the via hole in the first insulating pattern.

The second insulating patterns and the barrier patterns may be formed of materials having an etch selectivity with respect to the first insulating patterns, and the second insulating patterns may include a different material from the barrier patterns.

Forming the interconnection structure may include sequentially forming a first barrier layer, a metal layer, a second barrier layer, a first insulating layer, and a first hard mask pattern on the substrate; and patterning the first insulating layer, the second barrier layer, the metal layer, and the first barrier layer using the first hard mask pattern as an etch mask to form a first barrier pattern, the metal interconnection, a second barrier pattern, and the first insulating pattern, which are sequentially stacked on the substrate.

Forming the first barrier layer may include forming a seed layer on the substrate, the seed layer including manganese; and performing an annealing process on the seed layer such that the manganese of the seed layer reacts with oxygen from the substrate to convert the seed layer into a manganese oxide layer or a manganese-silicon oxide layer.

BRIEF DESCRIPTION OF THE DRAWINGS

Features will become apparent to those of ordinary skill in the art by describing in detail exemplary embodiments with reference to the attached drawings in which:

FIGS. 1A to 9A illustrate plan views of stages in a method of fabricating a semiconductor device according to an embodiment.

FIGS. 1B to 9B illustrate cross-sectional views taken along lines I-I' of FIGS. 1A to 9A, respectively, to illustrate stages in the method of fabricating a semiconductor device according to an embodiment.

FIGS. 10A to 12A illustrate plan views of stages in a method of fabricating a semiconductor device according to an embodiment.

FIGS. 10B to 12B illustrate cross-sectional views taken along lines II-II' of FIGS. 10A to 12A, respectively, to illustrate stages in the method of fabricating a semiconductor device according to an embodiment.

DETAILED DESCRIPTION

Figure 1A:
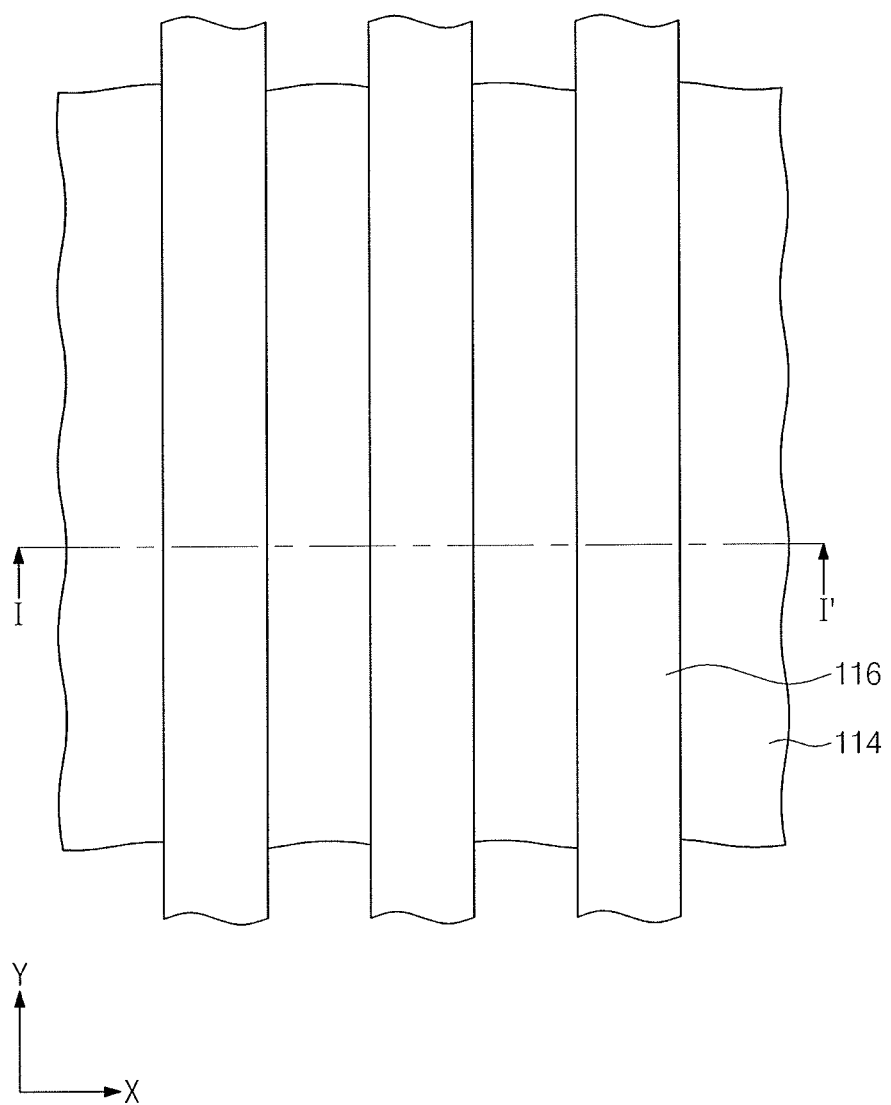

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another element, it can be directly on the other element, or intervening elements may also be present. In addition, it will also be understood that when an element is referred to as being "between" two elements, it can be the only element between the two elements, or one or more intervening elements may also be present. Like reference numerals refer to like elements throughout.

The terminology used herein is for the purpose of describing particular embodiments only and is not intended to limit the application. As used herein, the singular terms "a," "an" and "the" are intended to include the plural forms as well, unless the context clearly indicates otherwise. As used herein, the term "and/or" includes any and all combinations of one or more of the associated listed items. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, exemplary embodiments are described herein with reference to cross-sectional views and/or plan views that are idealized exemplary views. In the drawings, variations from the shapes of the views as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

FIGS. 1A to 9A illustrate plan views of stages in a method of fabricating a semiconductor device according to an embodiment. FIGS. 1B to 9B are cross-sectional views taken along lines I-I' of FIGS. 1A to 9A, respectively, to illustrate stages in the method of fabricating a semiconductor device according to an embodiment.

Figure 1B:
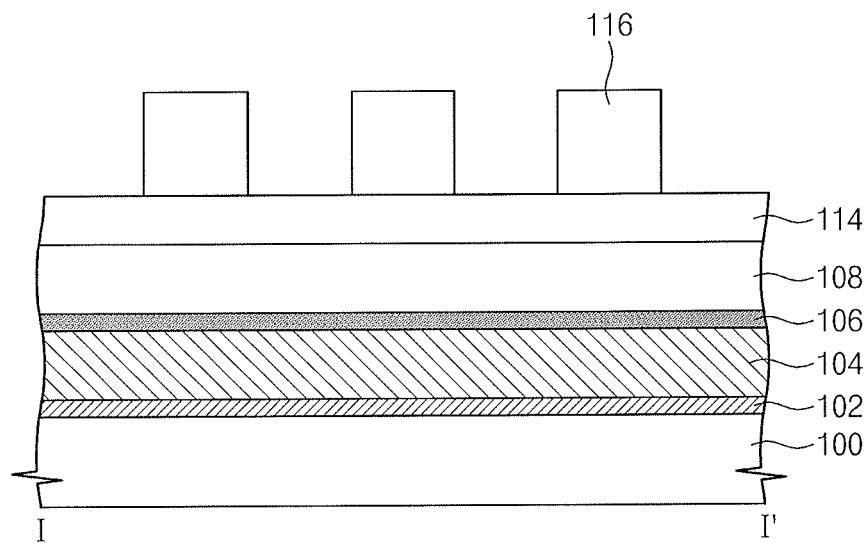

Referring to FIGS. 1A and 1B, a first barrier layer 102 may be formed on a substrate 100. The substrate 100 may include a silicon substrate or a silicon-on-insulator (SOI) substrate. In an implementation, the substrate 100 may further include an insulating layer such as silicon oxide (e.g., hydrated silicon oxide (SiOH)) or an interlayer dielectric. The substrate 100 may include an integrated circuit including at least one of a passive element, an active element, a memory element, or a logic element. The integrated circuit may be covered with the insulating layer.

Figure 1C:
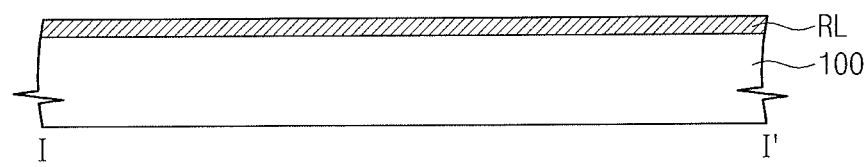
FIG. 1C illustrates a cross-sectional view of a stage in a method of forming a first barrier layer according to an embodiment.

Referring to FIG. 1C, forming the first barrier layer 102 may include forming a seed layer RL on the substrate 100 and performing an annealing process on the seed layer RL. For example, the seed layer RL may be a metal layer including manganese (Mn), an alloy layer formed of manganese-copper (MnCu), or a multi-layer including a manganese (Mn) layer and a copper (Cu) layer. By the annealing process, manganese (Mn) desorbed from copper (Cu) of the seed layer RL may be moved to a surface of the substrate 100 and may react with oxygen contained in the substrate 100. Thus, the seed layer RL may be converted into (or replaced with) a manganese oxide (MnO) layer or a manganese-silicon oxide (Mn(SiO$_3$)) layer.

In an implementation, the first barrier layer 102 may include a barrier metal layer. The barrier metal layer may be formed by a chemical vapor deposition (CVD) process or a physical vapor deposition (PVD) process. For example, the barrier metal layer may include at least one of tantalum (Ta), tantalum nitride (TaN), tantalum-silicon nitride (TaSiN), or tungsten nitride (WN).

Referring to FIGS. 1A and 1B, a metal layer 104 may be formed on the first barrier layer 102. The metal layer 104 may be formed by a PVD process or a CVD process. For example, the metal layer 104 may include copper (Cu).

A second barrier layer 106 may be formed on the metal layer 104. For example, the second barrier layer 106 may include at least one of silicon nitride (SiN), silicon carbonitride (SiCN), or aluminum nitride (AlN). The metal layer 104 and the second barrier layer 106 may be formed in-situ in a same chamber. The second barrier layer 106 may be formed after the formation of the metal layer 104. The metal layer 104 and the second barrier layer 106 may be sequentially formed in a vacuum state in the same chamber, and moisture may not be provided to a surface of the metal layer 104. As a result, it is possible to prevent a metal oxide layer (e.g., copper oxide (CuO)) from being formed on the surface of the metal layer 104.

In an implementation, the second barrier layer 106 may be formed in an additional chamber, e.g., different from the chamber in which the metal layer 104 is formed. In this case, a metal oxide layer may be formed on the metal layer 104. However, the metal oxide layer may be very thin, and it may not affect operation of the semiconductor device. Thus, an additional process (e.g., a cleaning process) for removing the metal oxide layer may not be required. In an implementation, the additional process (e.g., the cleaning process) for removing the metal oxide layer may be performed after the formation of the metal oxide layer.

A first insulating layer 108 may be formed on the second barrier layer 106. For example, the first insulating layer 108 may include a carbon-based polymer material or a silicon-based insulating material. For example, the silicon-based insulating material may include methyl silsesquioxane (MSQ; SiO:CH$_3$) or a-SiOC (SiOC:H). For example, the carbon-based polymer material may include polyallylether-based resin, ring-shaped fluororesin, siloxane copolymer, polyallylether fluoride-based resin, polypentafluorostylene, polytetrafluorostylene-based resin, polyimide fluoride resin, polynaphthalene fluoride, or polyhexamethyleneguanidine (Polycide) resin.

A hard mask layer 114 may be formed on the first insulating layer 108. The hard mask layer 114 may include a material having an etch selectivity with respect to the first insulating layer 108. For example, the hard mask layer 114 may include silicon oxide or silicon nitride.

A thermal treatment process may be performed on the metal layer 104 after the formation of the hard mask layer 114. For example, the thermal treatment process may be performed a temperature which is equal to or higher than a room or ambient temperature (25 degrees Celsius) and equal to or lower than 300 degrees Celsius. A grain size of a metal crystal included in the metal layer 104 may be increased by the thermal treatment process, and thus, a resistance of the metal layer 104 after the thermal treatment process may be lower than that of the metal layer 104 before the thermal treatment process. In an implementation, the thermal treatment process may be performed before the formation of the first insulating layer 108 and after the formation of the second barrier layer 106.

First resist patterns 116 may be formed on the hard mask layer 114. The first resist patterns 116 may be arranged in a first direction X and may extend in a second direction Y intersecting the first direction X. For example, the first resist patterns 116 may be sequentially or repeatedly arranged along the first direction X such that the first resist patterns 116 are spaced apart along the first direction X.

Figure 2A:
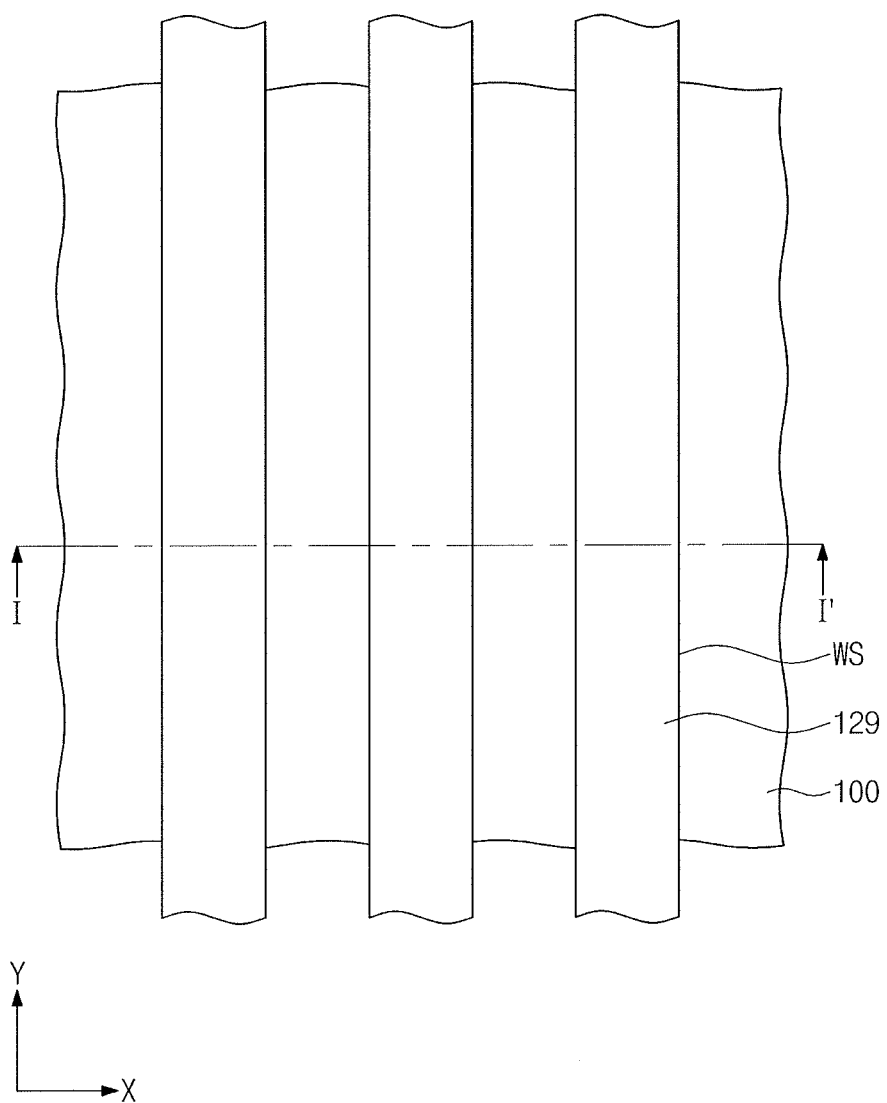
Figure 2B:
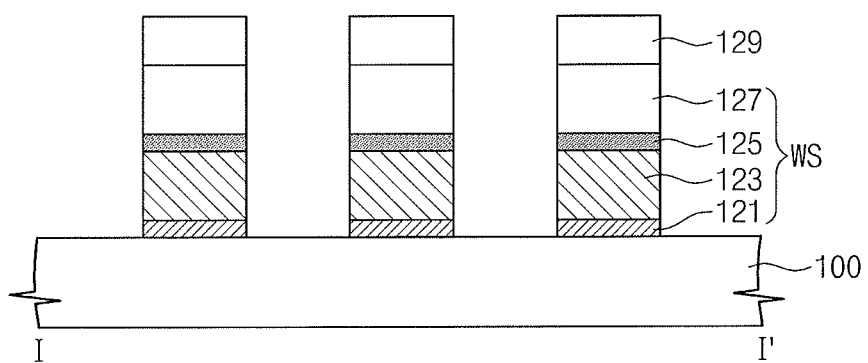

Referring to FIGS. 2A and 2B, the hard mask layer 114 exposed by the first resist patterns 116 may be etched to form hard mask patterns 129. In addition, the first insulating layer 108, the second barrier layer 106, the metal layer 104, and the first barrier layer 102 may be sequentially etched using the hard mask patterns 129 as etch masks by an anisotropic etching process to form interconnection structures WS. Each of the interconnection structures WS may include a first barrier pattern 121, a metal interconnection 123, a second barrier pattern 125, and a first insulating pattern 127 sequentially stacked on the substrate 100. The interconnection structures WS may be arranged, e.g., repeatedly arranged, in parallel to each other and may extend in the second direction Y.

The first resist patterns 116 may be removed after the formation of the hard mask patterns 129. In an implementation, the first resist patterns 116 may be removed after the formation of the interconnection structures WS. The first resist patterns 116 may be removed by an ashing process.

Figure 3A:
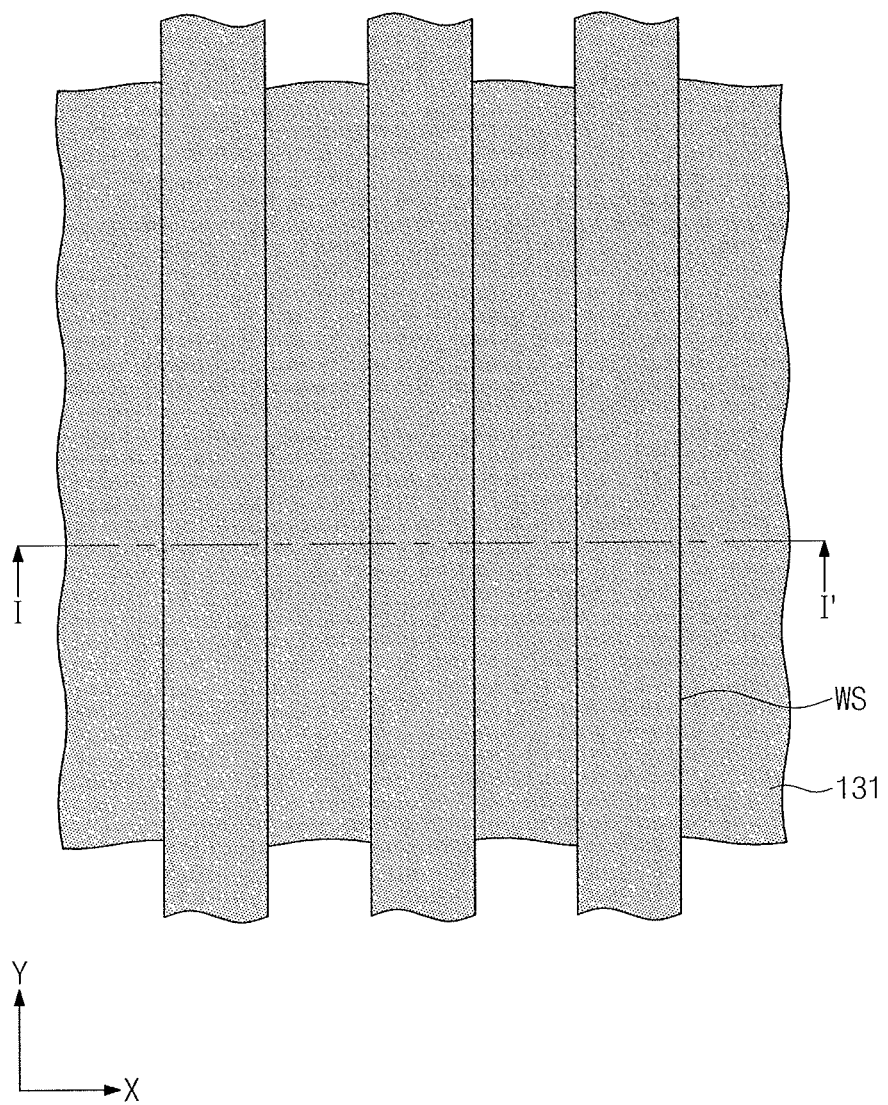
Figure 3B:
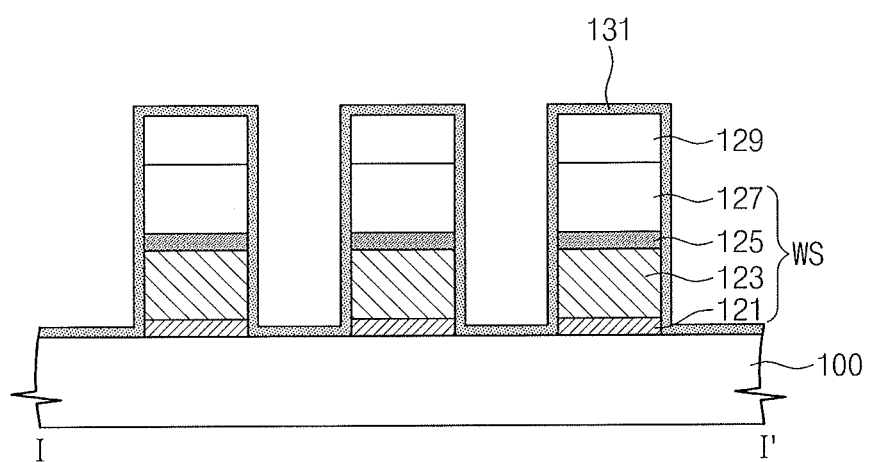

Referring to FIGS. 3A and 3B, a third barrier layer 131 may be formed on the substrate 100 after the formation of the interconnection structures WS. The third barrier layer 131 may be formed to conformally cover a top surface of the substrate 100 exposed by the interconnection structures WS, sidewalls of the interconnection structures WS, and top surfaces of the hard mask patterns 129. For example, each sidewall of the interconnection structures WS may include a sidewall of the first barrier pattern 121, a sidewall of the metal interconnection 123, a sidewall of the second barrier pattern 125, and a sidewall of the first insulating pattern 127. The third barrier layer 131 may be formed of a material having an etch selectivity with respect to the first insulating pattern 127. In an implementation, the third barrier layer 131 may be formed of, e.g., silicon nitride (SiN), silicon carbonitride (SiCN), and/or aluminum nitride (AlN).

A process of forming the third barrier layer 131 and the etching process for forming the interconnection structures WS may be performed in-situ in the same chamber. The etching process for forming the interconnection structures WS and the process of forming the third barrier layer 131 may be performed in a vacuum state in the same chamber, and moisture may not be provided to the sidewall of the metal interconnection 123. As a result, it is possible to prevent a metal oxide layer (e.g., copper oxide (CuO)) from being formed on the sidewall of the metal interconnection 123.

Figure 4A:
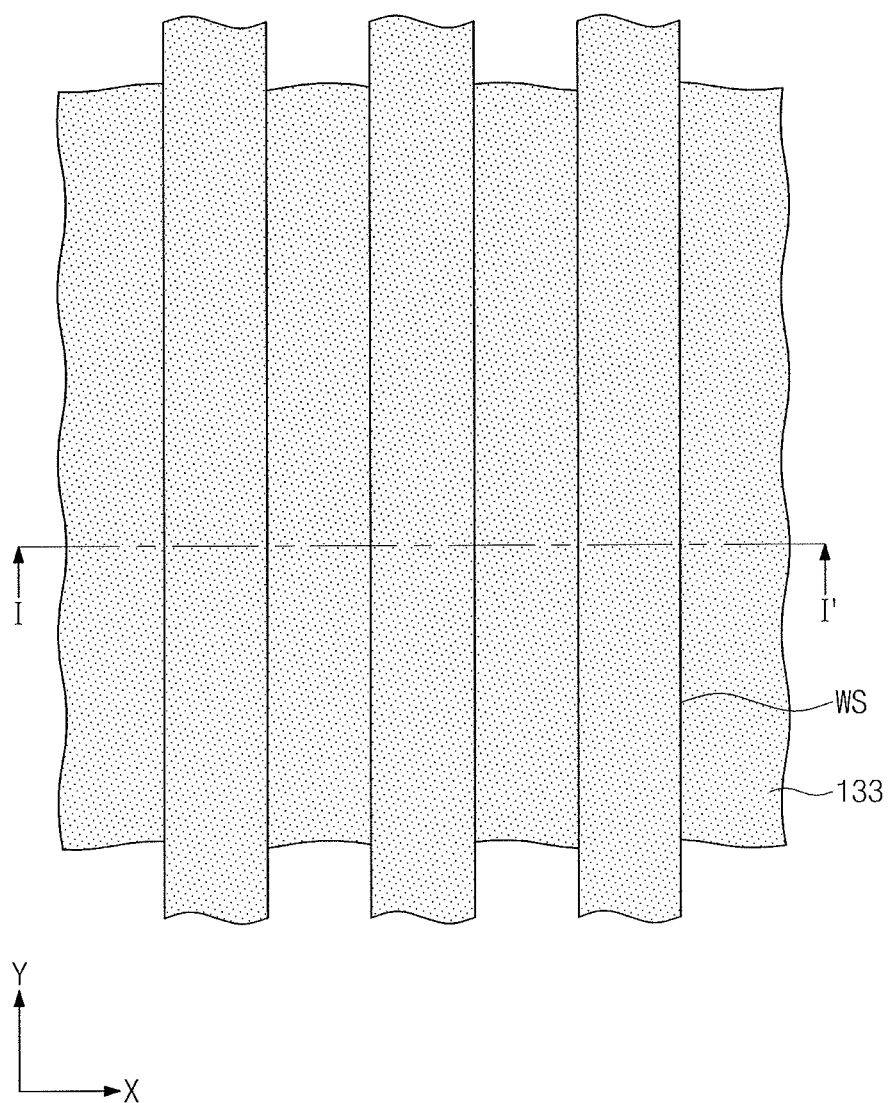
Figure 4B:
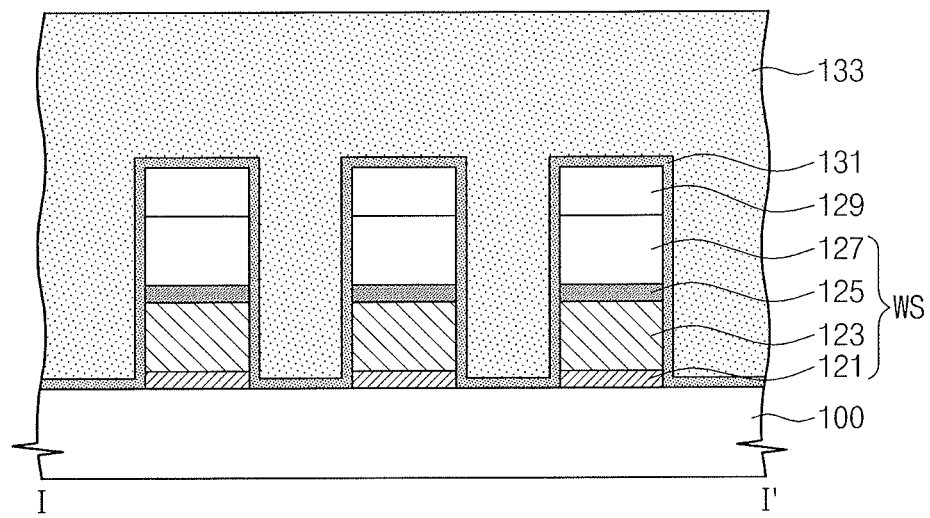

Referring to FIGS. 4A and 4B, a second insulating layer 133 may be formed on the substrate 100. The second insulating layer 133 may cover the third barrier layer 131 and may fill spaces between the interconnection structures WS. In an implementation, the second insulating layer 133 may completely fill the spaces between the interconnection structures WS, as illustrated in FIG. 4B.

Figure 4C:
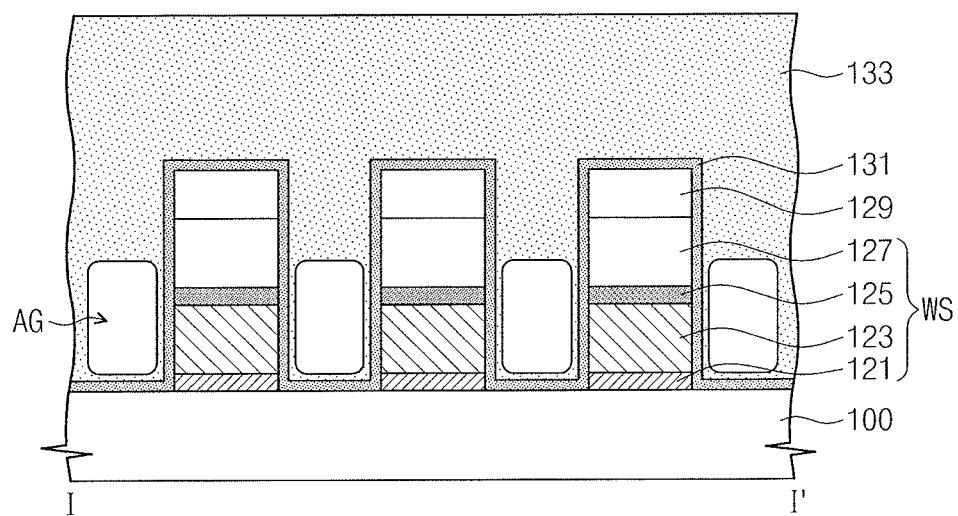
FIG. 4C illustrates a cross-sectional view corresponding to the line I-I' of FIG. 4A to illustrate a stage in a method of fabricating a semiconductor device according to an embodiment.

In an implementation, as illustrated in FIG. 4C, an air gap AG surrounded by the second insulating layer 133 may be provided between the interconnection structures WS adjacent to each other. The formation of the air gap AG may include adjusting conditions (e.g., pressure and/or temperature) of the process of forming the second insulating layer 133 to not completely fill the space between the interconnection structures WS with the second insulating layer 133. In an implementation, the second insulating layer 133 may be formed of a material having a poor step coverage characteristic, and thus the second insulating layer 133 may close a top end of the space between the interconnection structures WS in a state in which the second insulating layer 133 does not completely fill the space between interconnection structures WS. As a result, the air gap AG may be formed between the interconnection structures WS. A top end of the air gap AG may be formed at a lower level than a top surface of the first insulating pattern 127.

The second insulating layer 133 may be formed of an insulating material having an etch selectivity with respect to the first insulating pattern 127. In an implementation, the second insulating layer 133 may include, e.g., a carbon-based polymer material or a silicon-based insulating material. In an embodiment, when the first insulating pattern 127 is formed of one of the carbon-based polymer material and the silicon-based insulating material, the second insulating layer 133 may be formed of the other of the carbon-based polymer material and the silicon-based insulating material. For example, the silicon-based insulating material may include methyl silsesquioxane (MSQ; $SiO:CH_3$) or a-SiOC (SiOC:H). For example, the carbon-based polymer material may include polyallylether-based resin, ring-shaped fluororesin, siloxane copolymer, polyallylether fluoride-based resin, polypentafluorostylene, polytetrafluorostylene-based resin, polyimide fluoride resin, polynaphthalene fluoride, or polyhexamethyleneguanidine (Polycide) resin.

In a method (e.g., a damascene method) of forming a metal interconnection, an insulating layer may be formed, and the insulating layer may be patterned to form a trench therein, and the trench may be filled with a conductive material. In this case, an inner surface of the trench may be damaged by the process of patterning the insulating layer, and thus, a dielectric constant of the insulating layer exposed by the trench may be increased. However, according to the above mentioned embodiment, the second insulating layer 133 may be formed after the formation of the metal interconnection 123. Thus, a process of patterning the second insulating layer 133 may be omitted in the method according to an embodiment. As a result, it is possible to prevent the second insulating layer 133 from being damaged by the patterning process.

Figure 5A:
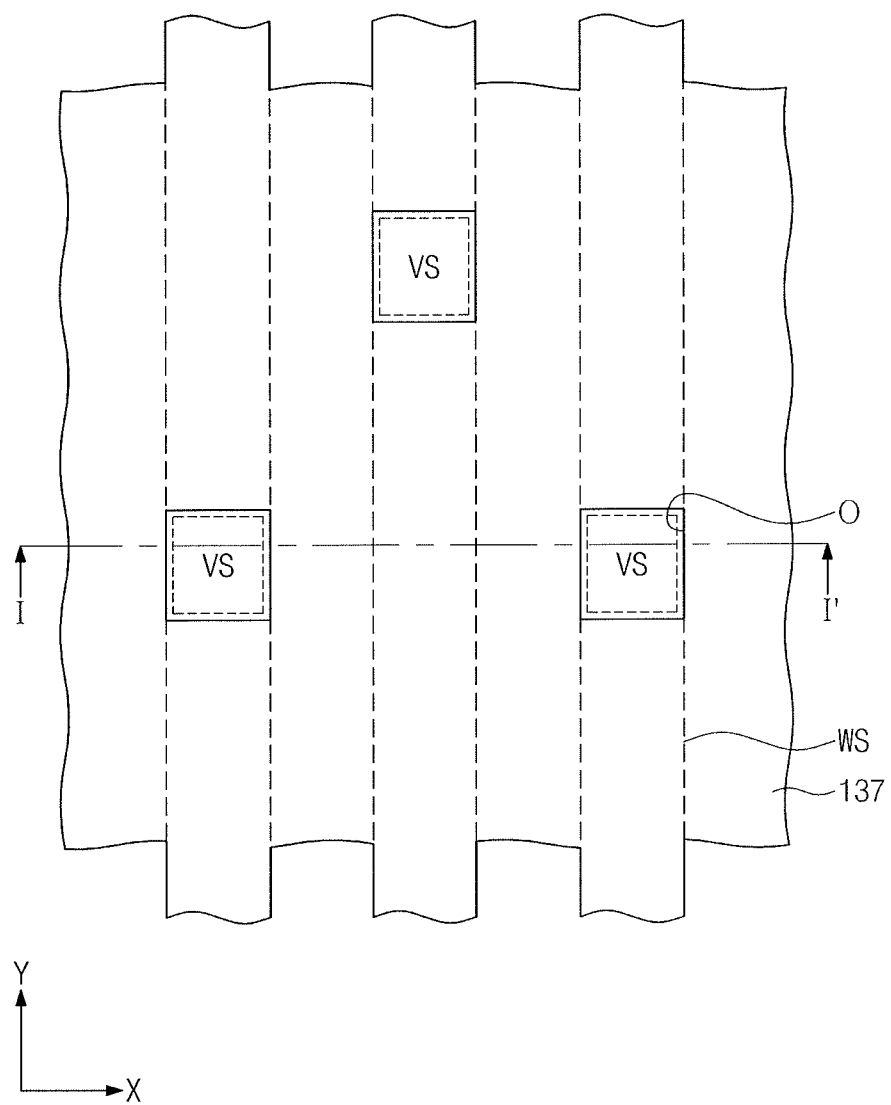
Figure 5B:
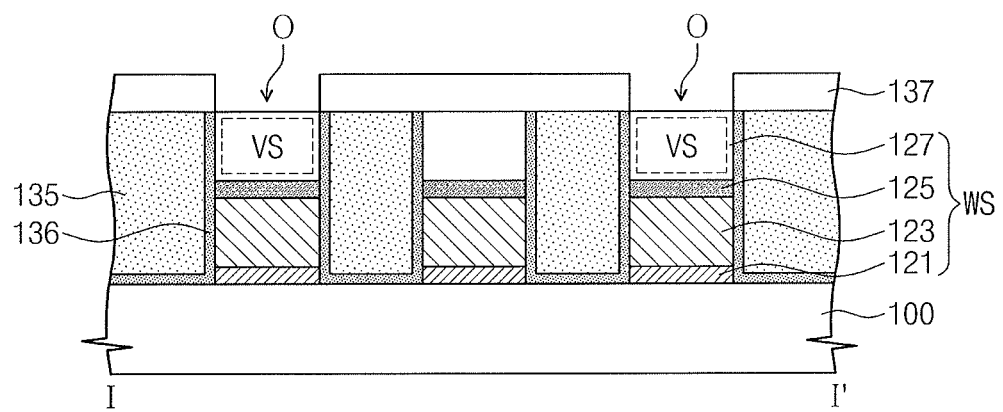

Referring to FIGS. 5A and 5B, a planarization process may be performed on the second insulating layer 133. The planarization process may be performed until the top surface of the first insulating pattern 127 is exposed, thereby removing an upper portion of the third barrier layer 131, an upper portion of the second insulating layer 133, and the hard mask patterns 129. The planarization process may include a chemical mechanical polishing (CMP) process or an etch-back process.

The upper portion of the third barrier layer 131 and the upper portion of the second insulating layer 133 may be etched to form a second insulating pattern 135 and a third barrier pattern 136 between the interconnection structures WS adjacent to each other. The second insulating patterns 135 may be formed at sides, e.g., both sides, of each of the interconnection structures WS. The third barrier pattern 136 may be between adjacent interconnection structures WS in the first direction X to cover the sidewalls, facing each other, of the adjacent interconnection structures WS and may extend onto the substrate 100 between the adjacent interconnection structures WS. For example, the third barrier pattern 136 may have a U-shaped cross section.

A second hard mask layer 137 may be formed on the interconnection structures WS and the second insulating patterns 135. The second hard mask layer 137 may include openings O exposing portions of the first insulating patterns 127. The second hard mask layer 137 may cover the second insulating patterns 135, the third barrier patterns 136, and other portions of the first insulating patterns 127. The portions of the first insulating patterns 127, which are exposed by the openings O of the second hard mask layer 137, may be defined as via regions VS. The via regions VS of the first insulating patterns 127 may correspond to regions of the interconnection structures WS that will be replaced with vias in a subsequent process.

In an implementation, a hard mask layer and a resist pattern may be sequentially formed on the substrate 100 having the interconnection structures WS and the second insulating patterns 135, and the hard mask layer may be etched using the resist pattern as an etch mask to form the second hard mask layer 137 having the openings O. The resist pattern may be removed after the formation of the second hard mask layer 137. The openings O may be arranged in a zigzag form along the first direction X, as illustrated in FIG. 5A. In an implementation, the openings O may be arranged in a line along the first direction X.

Figure 6A:
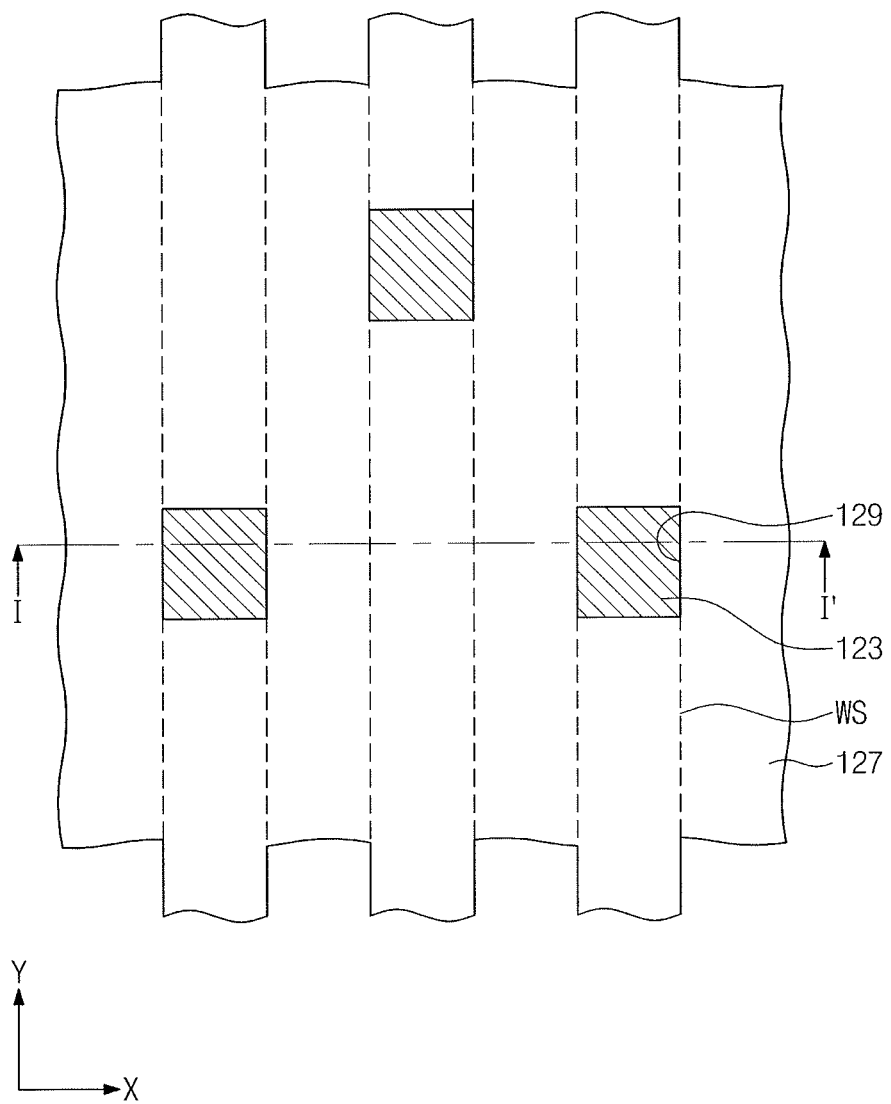
Figure 6B:
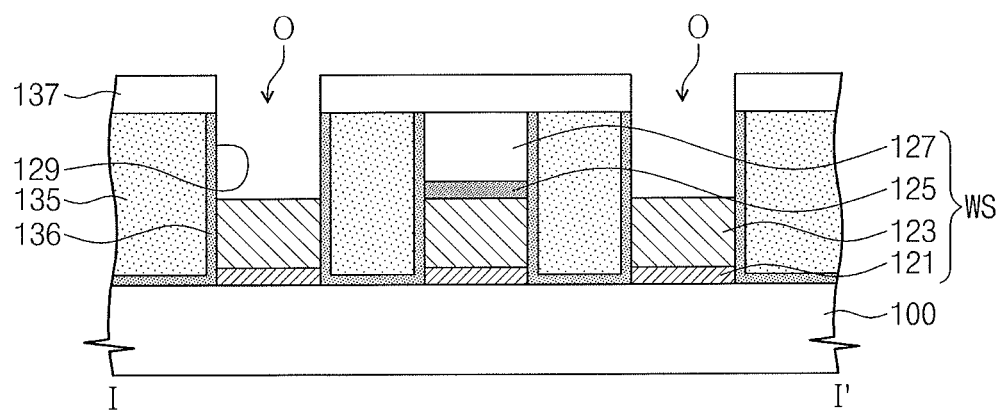

Referring to FIGS. 6A and 6B, the via regions VS of the first insulating patterns 127 exposed by the openings O of the second hard mask layer 137 may be selectively etched to form via holes 129 in the first insulating patterns 127 of the interconnection structures WS. The process of etching the via regions VS may be performed by a wet etching process or a dry etching process. Subsequently, portions of the second barrier patterns 125 exposed through the via holes 129 may be removed to expose the metal interconnections 123. Thus, portions of top surfaces of the metal interconnections 123 and portions of sidewalls, e.g., outer sidewalls, of the third barrier patterns 136 may be exposed through the via holes 129.

A width of the via hole 129 may be substantially equal to a width in the first direction X of the metal interconnection 123. This may be because the third barrier pattern 136 may support both sidewalls of the metal interconnection 123 and both sidewalls of the first insulating pattern 127 and may have an etch selectivity with respect to the etched first insulating pattern 127. Thus, even if the opening O of the second hard mask layer 137 were to be misaligned with the via region VS, the third barrier pattern 136 may not be etched as the via region VS of the first insulating pattern 127 is selectively removed. The second hard mask layer 137 may be removed after the formation of the via holes 129.

Figure 7A:
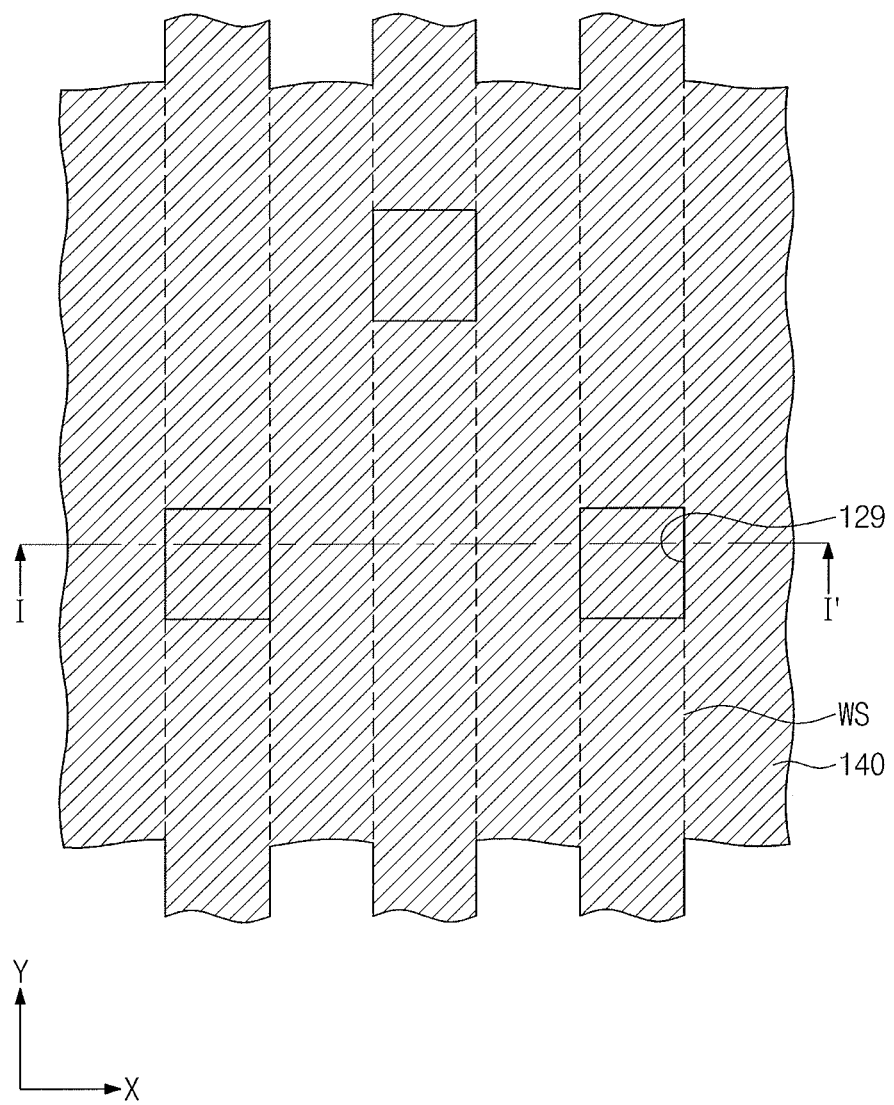
Figure 7B:
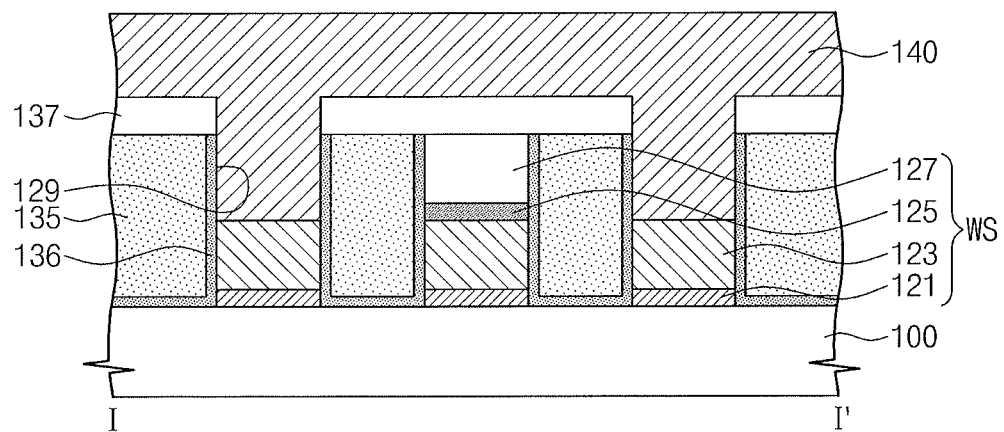

Referring to FIGS. 7A and 7B, a conductive layer 140 may be formed on the second hard mask layer 137 to fill the via holes 129. The conductive layer 140 may be in contact with the portions of the top surfaces of the metal interconnections 123 and the portions of the outer sidewalls of the third barrier patterns 136, which are exposed by the via holes 129. The conductive layer 140 may include a different metal material from the metal interconnection 123. For example, the conductive layer 140 may include ruthenium (Ru), cobalt (Co), nickel (Ni), titanium (Ti), tantalum (Ta), or an alloy including at least one thereof.

Figure 8A:
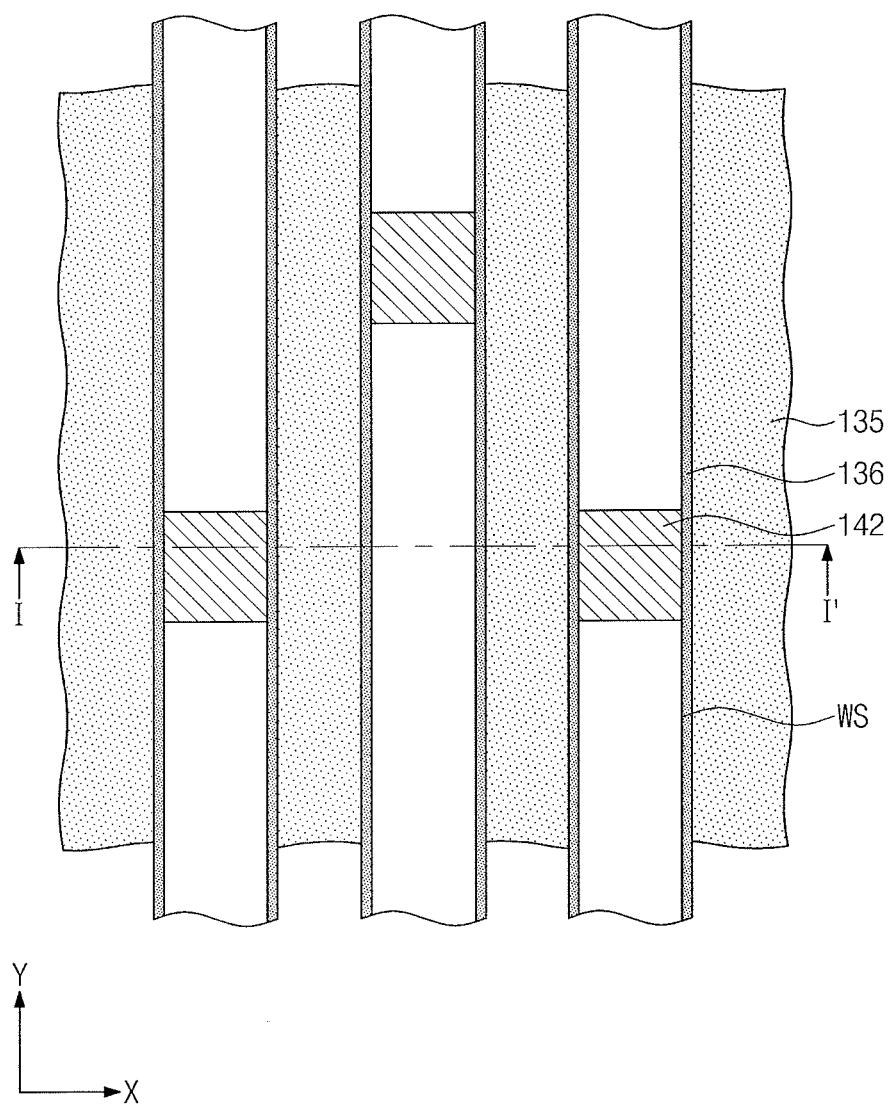
Figure 8B:
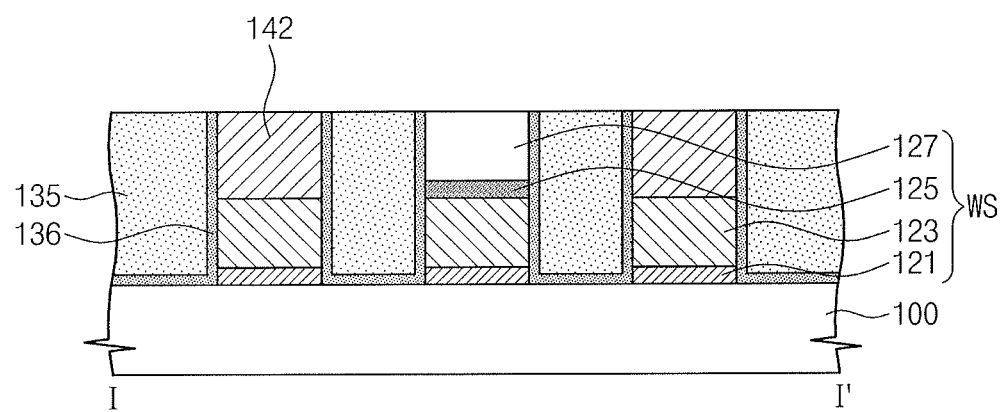

Referring to FIGS. 8A and 8B, an etching process may be performed on the conductive layer 140 to form vias 142 connected to the metal interconnections 123 in the via holes 129. Forming the vias 142 may include etching the conductive layer 140 until the top surfaces of the first insulating patterns 127 are exposed. The etching process for the formation of the vias 142 may include a CMP process or an etch-back process. The conductive layer 140 may be etched to expose top surfaces of the second insulating patterns 135 and top surfaces of the third barrier patterns 136. The via 142 may have a width equal to the width in the first direction X of the metal interconnection 123.

Figure 9A:
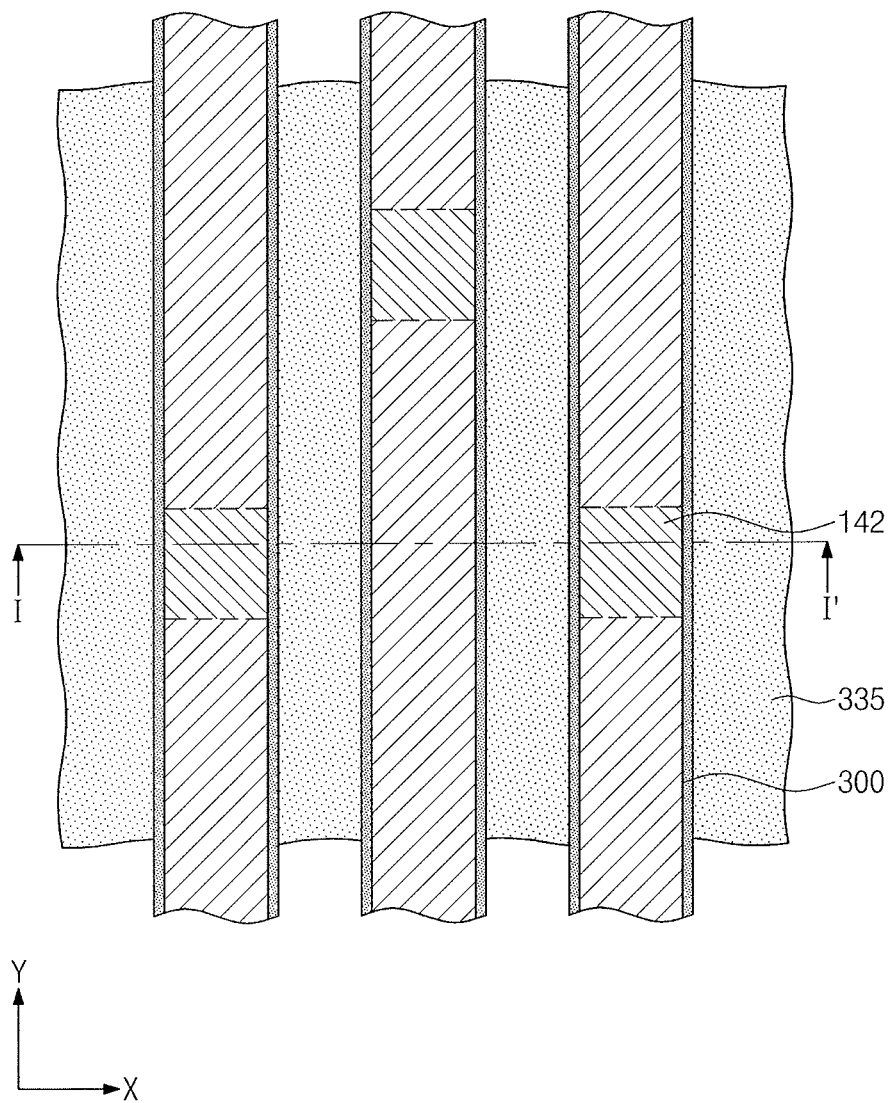
Figure 9B:
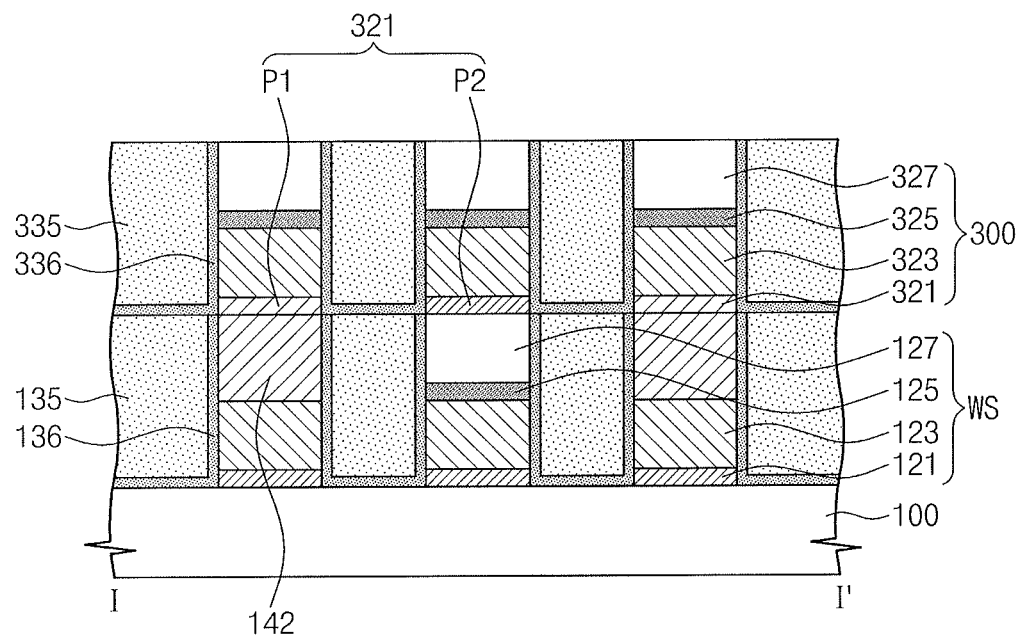

Referring to FIGS. 9A and 9B, the processes described with reference to FIGS. 1A to 5A and 1B to 5B may be repeated to form upper interconnection structures 300 on the interconnection structures WS in which the vias 142 are formed. Each of the upper interconnection structures 300 may include a first upper barrier pattern 321, an upper metal interconnection 323, a second upper barrier pattern 325, and a first upper insulating pattern 327 which are sequentially stacked on the via 142 and the first insulating pattern 127.

In an implementation, forming the first upper barrier pattern 321 may include forming an additional seed layer on the interconnection structures WS having the vias 142 and the second insulating patterns 135 and performing an annealing process on the additional seed layer. The additional seed layer may be formed of the same material as the seed layer RL of FIG. 1C. The additional seed layer may include a first portion in contact with the via 142 and a second portion in contact with the first insulating pattern 127. For example, the first portion of the additional seed layer may be in contact with the via 142 that does not include oxygen, and the second portion of the additional seed layer may be in contact with the first insulating pattern 127 that does include oxygen. Thus, manganese (Mn) of the first portion of the additional seed layer may not be combined with oxygen by the annealing process, and the first portion of the additional seed layer may not be replaced with a metal oxide layer (including oxygen). The first portion of the additional seed layer not replaced with the metal oxide layer may be a first portion P1 of the first upper barrier pattern 321. Manganese (Mn) of the second portion of the additional seed layer may be combined with oxygen from the first insulating pattern 127 by the annealing process, and thus the second portion of the additional seed layer may be replaced with a metal oxide layer including oxygen. The second portion of the additional seed layer replaced with the metal oxide layer may be a second portion P2 of the first upper barrier pattern 321.

For example, the first portion P1 of the first upper barrier pattern 321 may include a metal layer including manganese (Mn), an alloy layer formed of manganese-copper (MnCu), or a multi-layer including a manganese (Mn) layer and a copper (Cu) layer. For example, the second portion P2 of the first upper barrier pattern 321 may include a manganese oxide (MnO) layer or a manganese-silicon oxide ($Mn(SiO_3)$) layer. The first portion P1 of the first upper barrier pattern 321 may include the conductive material having electric conductivity, and the via 142 may electrically connect the metal interconnection 123 to the upper metal interconnection 323. In an implementation, the first upper barrier pattern 312 may include, e.g., tantalum (Ta), tantalum nitride (TaN), tantalum-silicon nitride (TaSiN), and/or tungsten nitride (WN).

A third upper barrier pattern 336 and a second upper insulating pattern 335 may be formed between adjacent upper interconnection structures 300. The third upper barrier pattern 336 may cover sidewalls of the adjacent upper interconnection structures 300 and may cover the top surfaces of the third barrier pattern 136 and the second insulating pattern 135. The second upper insulating pattern 335 may cover an inner surface of the third upper barrier pattern 336 and may completely fill a space between the adjacent upper interconnection structures 300.

Figure 9C:
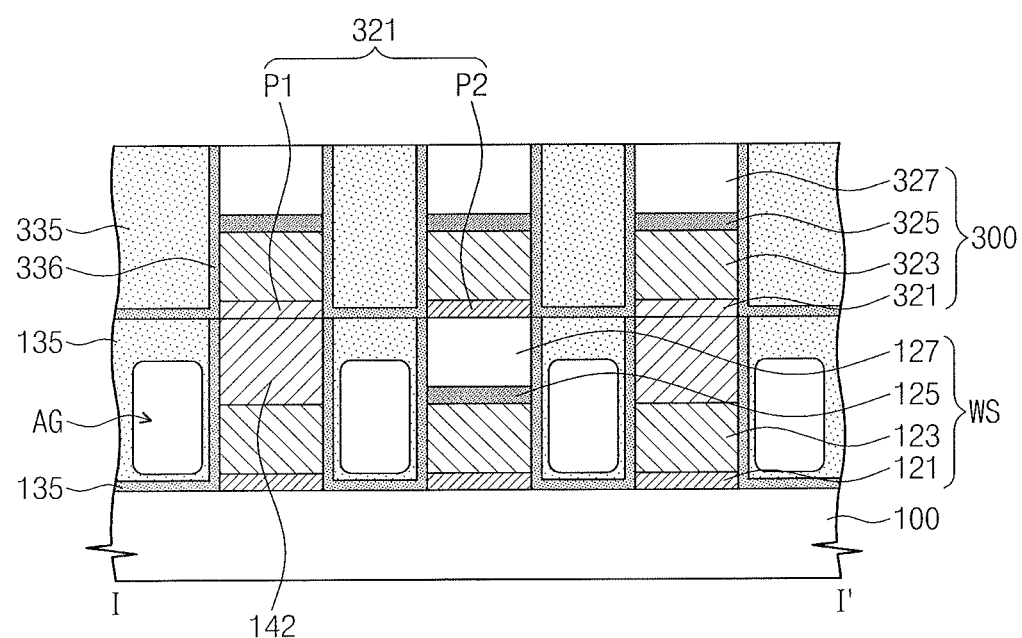
FIG. 9C illustrates a cross-sectional view corresponding to the line I-I' of FIG. 9A to illustrate a stage in a method of fabricating a semiconductor device according to an embodiment.

Referring to FIG. 9C, the planarization process may be performed on the second insulating layer 133 having the air gap AG described with reference to FIG. 4C, thereby forming the second insulating pattern 135 having the air gap AG. Next, as described with reference to FIGS. 5A to 9A and 5B to 9B, the second insulating patterns 135 may be formed, the vias 142 may be formed in the first insulating patterns 127 of the interconnection structures WS, and then, the upper interconnection structures 300 may be formed on the interconnection structures WS.

FIGS. 10A to 12A illustrate plan views of stages in a method of fabricating a semiconductor device according to an embodiment. FIGS. 10B to 12B illustrate cross-sectional views taken along lines II-II' of FIGS. 10A to 12A, respectively, to show the stages in a method of fabricating a semiconductor device according to an embodiment. In the present embodiment, the same elements as described in the embodiment of FIGS. 1A to 9A and 1B to 9B will be indicated by the same reference numerals or the same reference designators, and the descriptions to the same elements and or the same processes as in the embodiment of FIGS. 1A to 9A and 1B to 9B may be omitted or mentioned briefly.

Figure 10A:
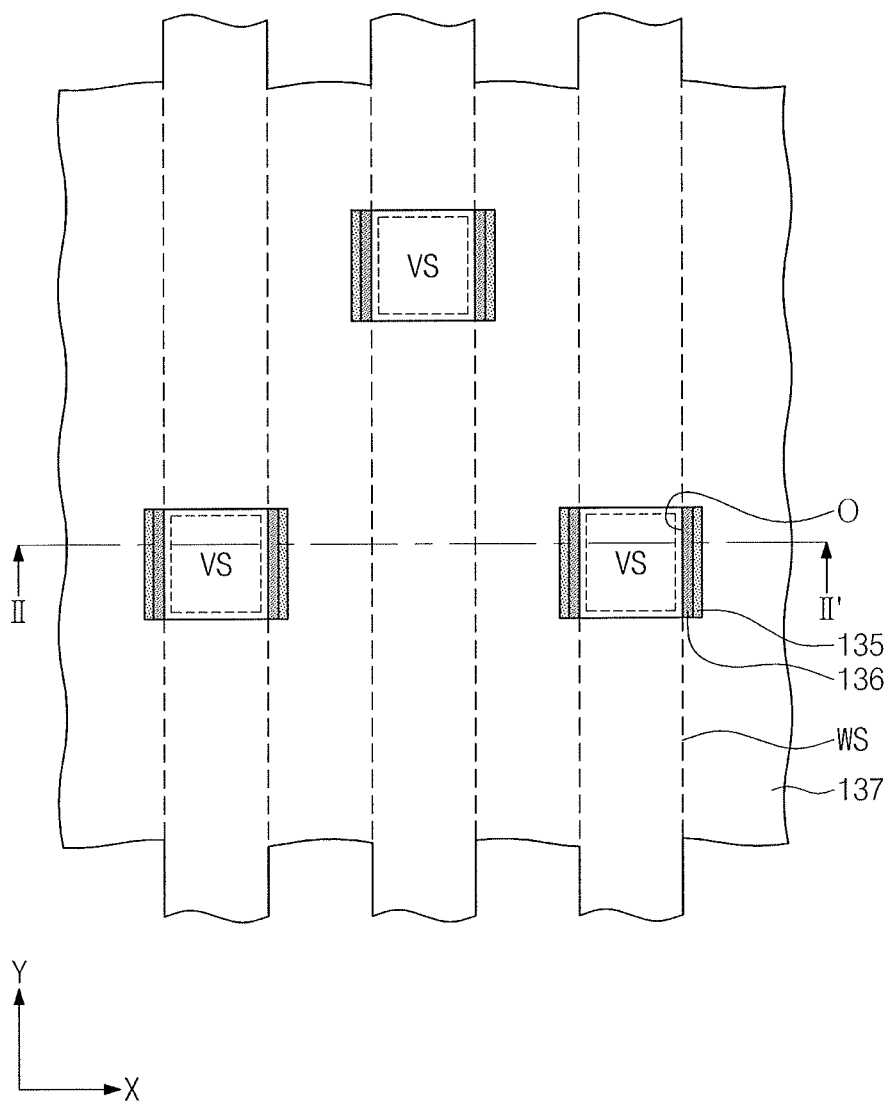
Figure 10B:
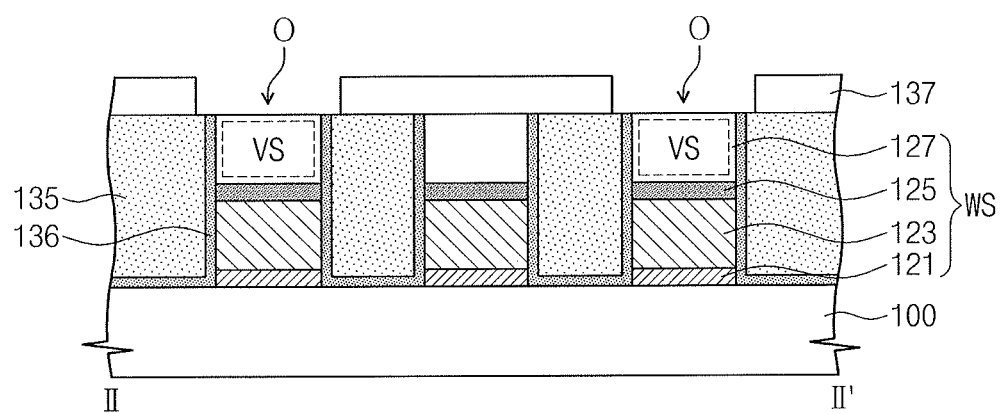

Referring to FIGS. 10A and 10B, a second hard mask layer 137 including openings O may be formed on the interconnection structures WS and the second insulating patterns 135. A width in the first direction X of the opening O may be greater than a width in the first direction X of the first insulating pattern 127. In this case, the opening O may expose the via region VS and may also expose a top surface of a portion of the second insulating pattern 135 and a top surface of a portion of the third barrier pattern 136, which are adjacent to the via region VS of the first insulating pattern 127.

Figure 11A:
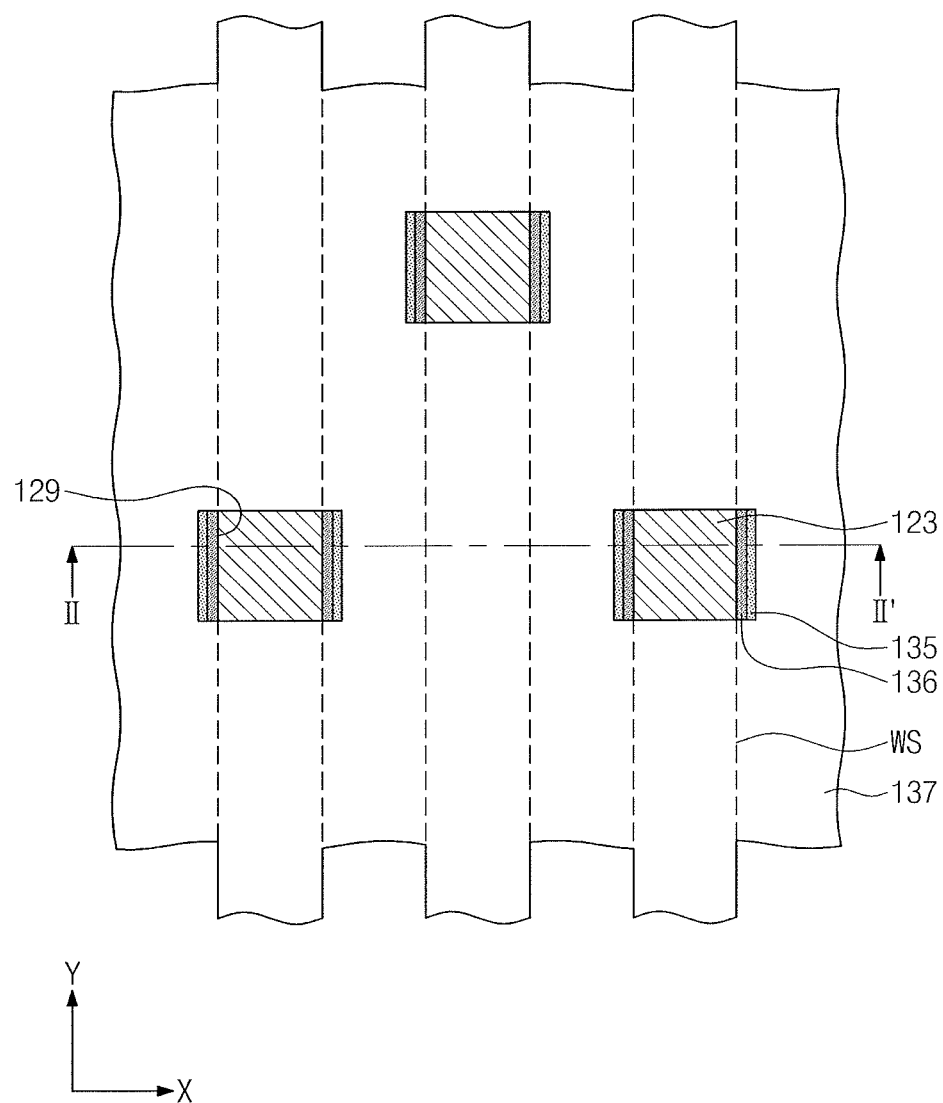
Figure 11B:
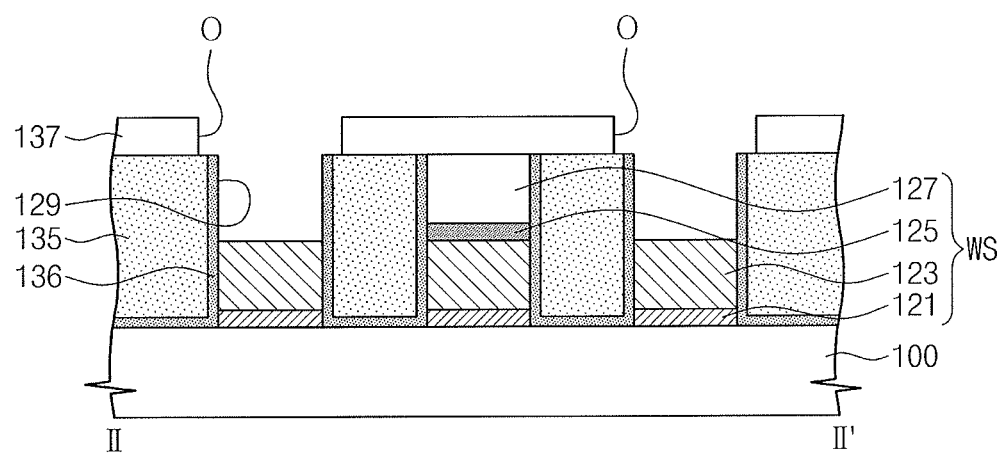

Referring to FIGS. 11A and 11B, the via regions VS exposed by the openings O and the second barrier patterns 125 under the exposed via regions VS may be selectively etched to form via holes 129. The via hole 129 may expose a portion of the top surface of the metal interconnection 123 and a portion of the outer sidewall of the third barrier pattern 136.

The etching process for forming the via holes 129 may be performed in a state in which the top surface of the portion of the second insulating pattern 135 and the top surface of the portion of the third barrier pattern 136 are exposed by the opening O. In this case, the first insulating pattern 127 may include the material having an etch selectivity with respect to the second insulating pattern 135 and the third barrier pattern 136, the second insulating pattern 135 and the third barrier pattern 136 may not be etched in the etching process but the via region VS of the first insulating pattern 127 may be selectively etched.

Figure 12A:
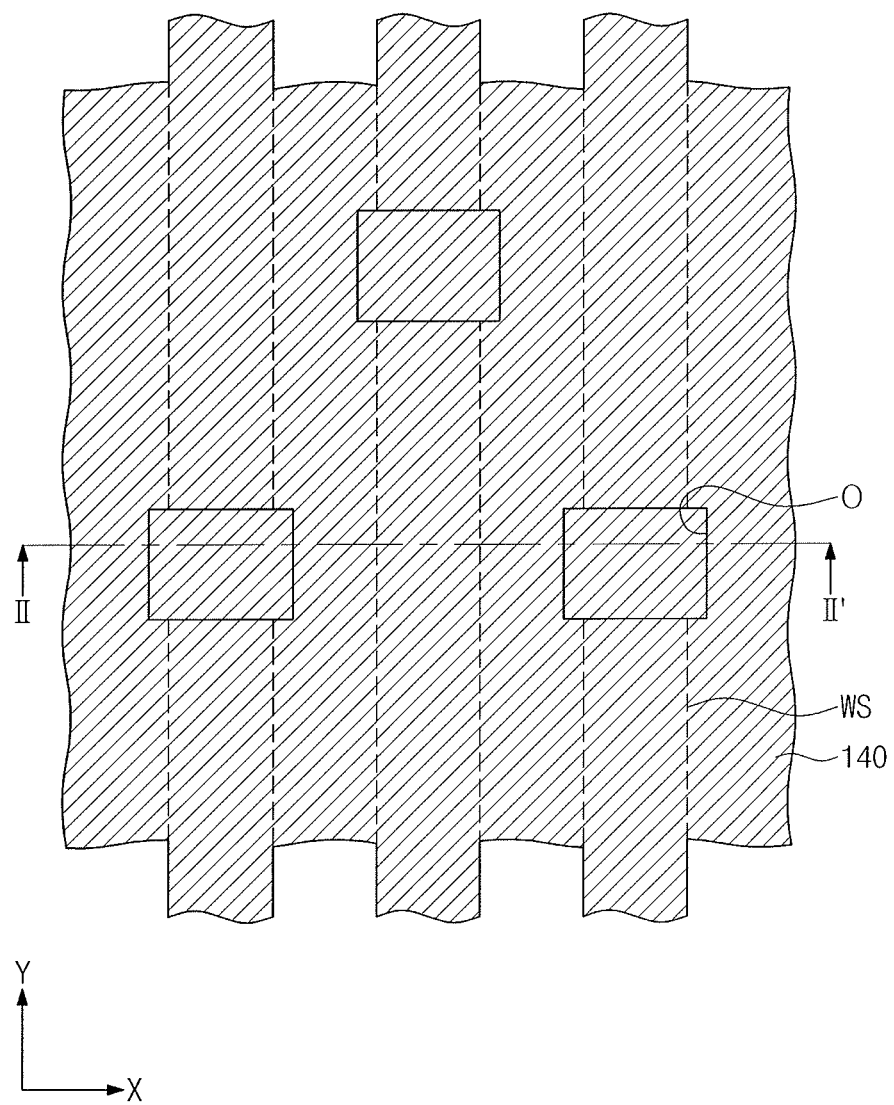
Figure 12B:
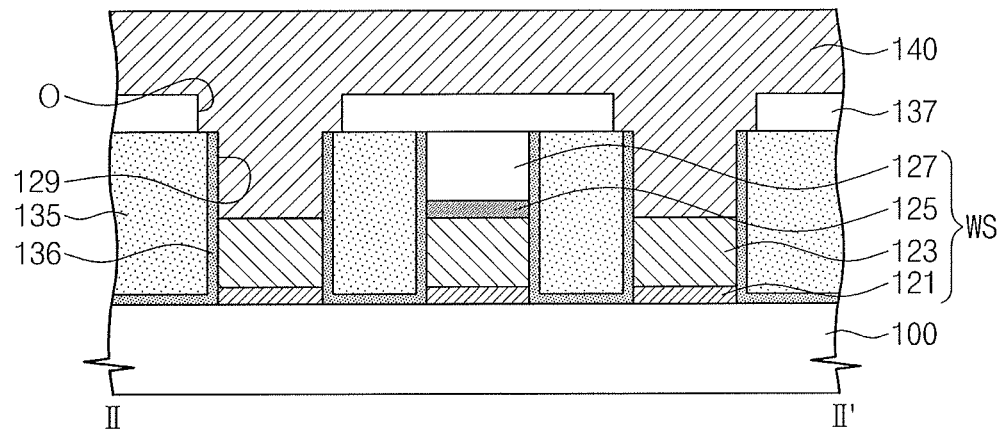

Referring to FIGS. 12A and 12B, a conductive layer 140 may be formed on the second hard mask layer 137 to fill the via holes 129. The conductive layer 140 may be in contact with the portions of the top surfaces of the metal interconnections 123 and the portions of the outer sidewalls of the third barrier patterns 136 exposed by the via holes 129 and may also be in contact with the top surfaces of the portions of the second insulating pattern 135 and the third barrier pattern 136.

Referring again to FIGS. 8A and 8B, the conductive layer 140 may be etched until the top surfaces of the first insulating patterns 127 are exposed, thereby forming vias 123 in the via holes 129, respectively.

By way of summation and review, as semiconductor devices have been highly integrated, widths and thicknesses of metal interconnections have been reduced. In addition, aspect ratios of contact holes have been increased. Thus, issues relating to completely filling a contact hole with a metal interconnection have been considered.

According to embodiments, the interconnection structure including the metal interconnection and the first insulating pattern may be formed, the barrier patterns may be formed to cover both sidewalls of the interconnection structure, and the second insulating pattern may be formed at a side of the interconnection structure. The first insulating pattern may be formed of a material having an etch selectivity with respect to the barrier pattern and the second insulating pattern, and the first insulating pattern may be etched to form the via hole having the same width as the metal interconnection in the first insulating pattern, without a limitation of mask alignment.

The embodiments may provide methods of fabricating a semiconductor device with improved reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a semiconductor device, the method comprising:
   forming at least one interconnection structure that includes a metal interconnection and a first insulating pattern sequentially stacked on a substrate;
   forming barrier patterns covering sidewalls of the interconnection structure;
   forming second insulating patterns at sides of the interconnection structure, the second insulating patterns being spaced apart from the metal interconnection and first insulating pattern of the interconnection structure with the barrier patterns interposed therebetween such that the barrier patterns isolate the first insulating pattern from the second insulating patterns;
   forming a via hole in the first insulating pattern by etching a portion of the first insulating pattern, the via hole exposing a top surface of the metal interconnection and sidewalls of the barrier patterns; and
   forming a via in the via hole.

2. The method as claimed in claim 1, wherein forming the interconnection structure includes:
   sequentially forming a first barrier layer, a metal layer, a second barrier layer, a first insulating layer, and a first hard mask pattern on the substrate; and
   patterning the first insulating layer, the second barrier layer, the metal layer, and the first barrier layer using the first hard mask pattern as an etch mask to form a first barrier pattern, the metal interconnection, a second barrier pattern, and the first insulating pattern, which are sequentially stacked on the substrate.

3. The method as claimed in claim 2, wherein forming the first barrier layer includes:
   forming a seed layer on the substrate, the seed layer including manganese; and
   performing an annealing process on the seed layer such that the manganese of the seed layer reacts with oxygen from the substrate to convert the seed layer into a manganese oxide layer or a manganese-silicon oxide layer.

4. The method as claimed in claim 1, wherein top surfaces of the barrier patterns, a top surface of the first insulating pattern, and top surfaces of the second insulating patterns are located at substantially the same level.

5. The method as claimed in claim 1, wherein forming the barrier patterns and the second insulating patterns includes:
   forming a barrier layer that conformally covers a top surface of the substrate and a surface of the interconnection structure;
   forming a second insulating layer that covers the barrier layer on the interconnection structure; and
   removing an upper portion of the second insulating layer and an upper portion of the barrier layer until a top surface of the first insulating pattern is exposed.

6. The method as claimed in claim 5, wherein:
   forming the barrier layer and an etching process for forming the interconnection structure are performed in-situ in a same chamber, and
   forming the barrier layer is performed after the etching process for forming the interconnection structure.

7. The method as claimed in claim 5, wherein:
   the method includes forming a plurality of the interconnection structures,
   forming the second insulating layer includes forming an air gap surrounded by the second insulating layer between the interconnection structures, and
   a top end of the air gap is formed at a lower level than the top surface of the first insulating pattern.

8. The method as claimed in claim 1, wherein:
   the second insulating patterns and the barrier patterns are formed of materials having an etch selectivity with respect to the first insulating pattern, and
   the second insulating patterns include a different material from the barrier patterns.

9. The method as claimed in claim 1, wherein forming the via hole includes selectively etching the portion of the first insulating pattern using an etchant having an etch selectivity with respect to the second insulating patterns and the barrier patterns.

10. The method as claimed in claim 1, wherein:
the first insulating pattern is formed of a carbon-based polymer material or a silicon-based insulating material,
the second insulating patterns are formed of a carbon-based polymer material or a silicon-based insulating material, and
the first insulating pattern is formed of a material having an etch selectivity with respect to the second insulating patterns.

11. The method as claimed in claim 1, wherein:
the via hole makes a width of the metal interconnection substantially equal to a width of a space between the sidewalls of the barrier patterns exposed by the via hole.

12. The method as claimed in claim 1, further comprising forming an upper interconnection structure on the interconnection structure in which the via is formed,
wherein forming the upper interconnection structure includes forming a first upper barrier pattern, an upper metal interconnection, a second upper barrier pattern, and an upper insulating pattern which are sequentially stacked on the interconnection structure.

13. A method of fabricating a semiconductor device, the method comprising:
forming interconnection structures that each include a metal interconnection and a first insulating pattern sequentially stacked on a substrate and extending in one direction;
forming barrier patterns that cover sidewalls of the interconnection structures;
forming second insulating patterns that are in contact with the barrier patterns and that fill spaces between the interconnection structures, the second insulating patterns extending in the one direction;
forming a hard mask layer such that the hardmask layer includes an opening on the interconnection structures and the second insulating patterns, the opening exposing a portion of the first insulating pattern;
etching the portion of the first insulating pattern exposed by the opening to form a via hole in the first insulating pattern, the via hole exposing a top surface of the metal interconnection and sidewalls of the barrier patterns; and
forming a via in the via hole,
wherein:
the second insulating patterns and the barrier patterns are formed of materials having an etch selectivity with respect to the first insulating pattern, and
the second insulating patterns include a different material from the barrier patterns.

14. The method as claimed in claim 13, wherein:
the first insulating patterns include a carbon-based polymer material or a silicon-based insulating material,
the second insulating patterns include a carbon-based polymer material or a silicon-based insulating material, and
the barrier patterns include at least one of silicon nitride, silicon carbonitride, or aluminum nitride.

15. The method as claimed in claim 13, wherein top surfaces of the barrier patterns, a top surface of the first insulating pattern, and top surfaces of the second insulating patterns are located at substantially the same level.

16. The method as claimed in claim 13, wherein the via hole makes a width of the metal interconnection substantially equal to a width of a space between the sidewalls of the barrier patterns exposed by the via hole.

17. A method of fabricating a semiconductor device, the method comprising:
forming interconnection structures that each include a metal interconnection and a first insulating pattern sequentially stacked on a substrate and extending in one direction;
forming barrier patterns that cover sidewalls of the interconnection structures;
forming second insulating patterns that are in contact with the barrier patterns and that fill spaces between the interconnection structures, the second insulating patterns extending in the one direction;
forming a via hole in the first insulating pattern by etching a portion of the first insulating pattern, the via hole exposing a top surface of the metal interconnection and sidewalls of the barrier patterns; and
forming a via in the via hole,
wherein:
the second insulating patterns and the barrier patterns are formed of materials having an etch selectivity with respect to the first insulating pattern, and
the second insulating patterns include a different material from the barrier patterns.

18. The method as claimed in claim 17, wherein forming the interconnection structure includes:
sequentially forming a first barrier layer, a metal layer, a second barrier layer, a first insulating layer, and a first hard mask pattern on the substrate; and
patterning the first insulating layer, the second barrier layer, the metal layer, and the first barrier layer using the first hard mask pattern as an etch mask to form a first barrier pattern, the metal interconnection, a second barrier pattern, and the first insulating pattern, which are sequentially stacked on the substrate.

19. The method as claimed in claim 17, wherein top surfaces of the barrier patterns, a top surface of the first insulating pattern, and top surfaces of the second insulating patterns are located at substantially the same level.

20. The method as claimed in claim 17, wherein the via hole makes a width of the metal interconnection substantially equal to a width of a space between the sidewalls of the barrier patterns exposed by the via hole.

* * * * *